US012080801B2

(12) United States Patent
Seebauer

(10) Patent No.: US 12,080,801 B2
(45) Date of Patent: Sep. 3, 2024

(54) METHOD OF CONTROLLING OXYGEN VACANCY CONCENTRATION IN A SEMICONDUCTING METAL OXIDE

(71) Applicant: The Board of Trustees of the University of Illinois, Urbana, IL (US)

(72) Inventor: Edmund G. Seebauer, Urbana, IL (US)

(73) Assignee: THE BOARD OF TRUSTEES OF THE UNIVERSITY OF ILLINOIS, Urbana, IL (US)

( * ) Notice: Subject to any disclaimer, the term of this patent is extended or adjusted under 35 U.S.C. 154(b) by 117 days.

(21) Appl. No.: 17/571,858

(22) Filed: Jan. 10, 2022

(65) Prior Publication Data

US 2022/0231171 A1    Jul. 21, 2022

Related U.S. Application Data

(60) Provisional application No. 63/137,971, filed on Jan. 15, 2021.

(51) Int. Cl.
*H01L 29/78* (2006.01)
*C23C 22/82* (2006.01)
(Continued)

(52) U.S. Cl.
CPC .......... *H01L 29/7869* (2013.01); *C23C 22/82* (2013.01); *C23C 22/83* (2013.01);
(Continued)

(58) Field of Classification Search
CPC ......... H01L 21/76831; H01L 21/30608; H01L 21/30655; H01L 21/823412;
(Continued)

(56) References Cited

U.S. PATENT DOCUMENTS 6,342,177 B1 * 1/2002 Kitaoka ............... C04B 35/472
                                                      264/307
7,846,822 B2   12/2010 Seebauer et al.
(Continued)

FOREIGN PATENT DOCUMENTS

JP          4106434 B2     6/2008
TW       201717406 A       5/2017

OTHER PUBLICATIONS

Aversang et al., "Controlled Formation of Native Defects in Ultrapure ZnO for the Assignment of Green Emissions to Oxygen Vacancies," J. Phys. Chem. C, 124, 23 (2020) pp. 12696-12704.
(Continued)

*Primary Examiner* — Duy Vu N Deo
(74) *Attorney, Agent, or Firm* — Crowell & Moring LLP

(57) ABSTRACT

A method of controlling oxygen vacancy concentration in a semiconducting metal oxide includes exposing a treated surface of a crystalline metal oxide to water at a temperature and pressure sufficient to maintain the water in a liquid phase. During the exposure, a portion of the water is adsorbed onto the treated surface and dissociates into atomic oxygen and hydrogen. The atomic oxygen is injected into and diffuses through the crystalline metal oxide, forming isolated oxygen interstitials and oxygen defect complexes. The isolated oxygen interstitials replace oxygen vacancies in the crystalline metal oxide.

19 Claims, 11 Drawing Sheets

(51) Int. Cl.
| | |
|---|---|
| C23C 22/83 | (2006.01) |
| C23F 1/30 | (2006.01) |
| H01L 21/3213 | (2006.01) |
| H01L 21/67 | (2006.01) |
| H01L 27/12 | (2006.01) |
| H01L 29/786 | (2006.01) |

(52) U.S. Cl.
CPC .......... C23F 1/30 (2013.01); H01L 21/32134 (2013.01); H01L 21/67075 (2013.01); H01L 27/1225 (2013.01)

(58) Field of Classification Search
CPC ......... H01L 21/823431; H01L 27/0886; H01L 21/02236; H01L 21/02247; H01L 21/02381; H01L 21/0243; H01L 21/0245; H01L 21/02488; H01L 21/02507; H01L 21/02532; H01L 21/3065; H01L 21/02447; H01L 21/02505; H01L 29/0673; H01L 29/42392; H01L 29/66439; H01L 29/775; H01L 29/78696; B82Y 10/00
USPC ................................................ 438/689–714
See application file for complete search history.

(56) References Cited

U.S. PATENT DOCUMENTS

| | | | |
|---|---|---|---|
| 7,968,440 B2 | 6/2011 | Seebauer | |
| 8,871,670 B2 | 10/2014 | Seebauer | |
| 10,161,062 B2 | 12/2018 | Seebauer et al. | |
| 2012/0172648 A1* | 7/2012 | Seebauer ................. | B01J 27/24 502/343 |
| 2020/0152458 A1* | 5/2020 | Song ................... | H01L 29/7869 |
| 2020/0243685 A1* | 7/2020 | Yamazaki ......... | H01L 21/02274 |

OTHER PUBLICATIONS

Diebold et al., "Perspective: A Controversial Benchmark System for Water-Oxide Interfaces: $H_2O/TiO_2(110)$," J. Chem. Phys. 147, (2017), pp. 40901-1-40901-3.

Dulub et al., "Observation of the Dynamical Change in a Water Monolayer Adsorbed on a ZnO Surface," Phys. Rev. Lett. 95, 136101 (2005), pp. 1-4.

Erhart et al., "First-Principles Study of Intrinsic Point Defects in ZnO: Role of Band Structure, Volume Relaxation, and Finite-Size Effects," Phys. Rev. B. 73, 205203 (2006), pp. 1-9.

Fang et al., "High Performance Electrocatalytic Conversion of $N_2$ to $NH_3$ Using Oxygen Vacancy Rich $TiO_2$ In Situ Grown on $Ti_3C_2T_x$ MXene," Adv. Energy Mater. 9, 1803406 (2019), pp. 1-9.

Gorai et al, "Kinetics of Oxygen Interstitial Injection and Lattice Exchange in Rutile TiO2," Appl. Phys. Lett. 104, 191602 (2014), pp. 1-4.

Gorai et al, "Measurement of Defect-Mediated Oxygen Self-diffusion in Metal Oxides," ECS J. Solid State Sci. Technol. 1, (2012), pp. Q21-Q24.

Gorai et al., "Surface-Assisted Defect Engineering of Point Defects in ZnO," Appl. Phys. Lett. 108, 241603 (2016), pp. 1-5.

Goyal et al., "A Computational Framework for Automation of Point Defect Calculations," Comput. Mater. Sci. 130, (2017), pp. 1-9.

Gunkel et al., "Oxygen Vacancies: The (In)visible Friend of Oxide Electronics," Appl. Phys. Lett. 116, 120505 (2020) pp. 1-7.

Heinhold et al., "Stability of the Surface Electron Accumulation Layers on the Nonpolar (1010) and (1120) faces of ZnO," J. Phys. Chem. C. 118, (2014), pp. 24575-24582.

Hollister et al., "Surface-Based Manipulation of Point Defects in Rutile TiO2," Appl. Phys. Lett. 102, 231601 (2013), pp. 1-5.

Huang et al., "First-Principles Study of Diffusion of Oxygen Vacancies and Interstitials in ZnO," J. Phys. Condens. Matter. 345802 (2009), p. 1-7.

Huttenhofer et al., "Anapole Excitations in Oxygen-Vacancy-Rich $TiO_{2-x}$ Nanoresonators: Tuning the Absorption for Photocatalysis in the Visible Spectrum," ACS Nano. 14, (2020), pp. 2456-2464.

Jang et al., "Observing Oxygen Vacancy Driven Electroforming in $Pt-TiO_2-Pt$ Device Via Strong Metal Support Interaction," Nano Lett. 16, (2016), pp. 2139-2144.

Janotti et al., "Native Point Defects in ZnO," Phys. Rev. B. 76, 165202 (2007), pp. 1-22.

Jeong et al., "First-Principles Description of Oxygen Self-Diffusion in Rutile TiO2: Assessment of Uncertainties due to Energy and Entropy Contributions," Phys. Chem. Chem. Phys. 20, (2018), pp. 17448-17457.

Kaewmaraya et al., "Water Adsorption on ZnO(1010): The Role of Intrinsic Defects," EPL (Europhysics Lett.) 97, 17014 (2012), pp. 1-5.

Kang et al., "Interface Engineering for Modulation of Charge Carrier Behavior in ZnO Photoelectrochemical Water Splitting," Adv. Funct. Mater. 29, 1808032 (2019), pp. 1-19.

Karzel et al., "Lattice Dynamics and Hyperfine Interactions in ZnO and ZnSe at high External Pressures," Phys. Rev. B. 53, 17 (1996), pp. 11425-11438.

Kim et al., Self-Compensated Insulating ZnO based Piezoelectric Nanogenerators, Adv. Funct. Mater. 24, (2014) pp. 6949-6955.

Kowalski et al., "Composition, Structure, and Stability of the Rutile TiO2 (110) Surface: Oxygen Depletion, Hydroxylation, Hydrogen Migration, and Water Adsorption," Phys. Rev. B. 79, 115410 (2009), pp. 1-16.

Kumar et al., "Zinc Oxide Based Photocatalysis: Tailoring Surface-Bulk Structure and Related Interfacial Charge Carrier Dynamics for Better Environmental Applications," RSC Adv., 5 (2015) pp. 3306-3351.

Lee et al., "Doping and Compensation in Nb-doped Anatase and Rutile $TiO_2$," J. Appl. Phys. 113 (2013), pp. 213706-1-213706-6.

Li and Seebauer, "Surface-Based Control of Oxygen Interstitial Injection into ZnO via Sub-Monolayer Sulfur Adsorption," J. Phys. Chem. C, 120 (2016) pp. 23675-23682.

Li and Seebauer., "Defect Engineering in Semiconducting Oxides: Control of ZnO Surface Potential via Temperature and Oxygen Pressure," AIChE Journal, 62, 2 (2016) pp. 500-507.

Li et al., "Controlling Oxygen Vacancies and Properties of ZnO," Curr. Appl. Phys. 14 (2014) pp. 521-527.

Lyons et al., "First-Principles Characterization of Native-Defect-Related Optical Transitions in ZnO," J. Appl. Phys. 035704 (2017), pp. 1-12.

Meyer et al., "Partial Dissociation of Water Leads to Stable Superstructures on the Surface of Zinc Oxide," Angew. Chemie—Int. Ed. 43, (2004), pp. 6641-6645.

Meyer et al., "Water Adsorption on ZnO(1010): from Single Molecules to Partially Dissociated Monolayers," Phys. Chem. Chem. Phys. 8, (2006), pp. 1513-1520.

Oba et al., "Native Defects in Oxide Semiconductors: A Density Functional Approach," J. Phys. Condens. Matter. 22, 384211 (2010), pp. 1-9.

Paris et al., "Multiscale Investigation of Oxygen Vacancies in TiO2 Anatase and Their Role in Memristor's Behavior," J. Phys. Chem. C. 120, (2016), pp. 22045-22053.

Reynolds et al., "Valence-band Ordering in ZnO," Phys. Rev. B. 60, 4 (1999), pp. 2340-2344.

Tu et al., "Control of Oxygen Vacancies in ZnO Nanorods by Annealing and Their Influence on ZnO/PEDOT: PSS Diode Behaviour," J. Mater. Chem. C. 6, (2018), pp. 1815-1821.

Verma et al., "Lattice Defect-Formulated Ferromagnetism and UV Photo-Response in Pure and Nd, Sm Substituted ZhO Thin Films," Phys. Chem. Chem. Phys. 21, (2019) pp. 12540-12554.

Wang et al., "Efficient Ultraviolet Photodetectors based on TiO 2 Nanotube Arrays with Tailored Structures," RSC Adv. 5, (2015), pp. 52388-52394.

Wang et al., "Probing Equilibrium of Molecular and Deprotonated Water on $TiO_2(110)$," Proc. Natl. Acad. Sci. 114, 8 (2017), pp. 1801-1805.

(56) References Cited

OTHER PUBLICATIONS

Wu et al., "Multichannel Porous $TiO_2$ Hollow Nanofibers with Rich Oxygen Vacancies and High Grain Boundary Density Enabling Superior Sodium Storage Performance," Small, 13, 1700129 (2017), pp. 1-8.

Yan et al., "Structure and Energetics of Water Adsorbed on the ZnO(1010) Surface," Phys. Rev. B—Condens. Matter Mater. Phys. 72, 235406 (2005), pp. 1-6.

Zhang et al., "Direct Observation of Oxygen Vacancy Self-Healing on $TiO_2$ Photocatalysts for Solar Water Splitting," Angew. Chemie. 131, (2019), pp. 14229-14233.

Zhu et al., "Oxygen Vacancies Controlled Multiple Magnetic Phases in Epitaxial Single Crystal $Co_{0.5}(Mg_{0.55}Zn_{0.45})_{0.5}O_{1-v}$ thin films," Sci. Rep. 6, 24188 (2016) pp. 1-9.

Balajka et al., "Surface Structure of $TiO_2$ Rutile (011) Exposed to Liquid Water," *J. Phys. Chem. C*, 121 (2017), pp. 26424-26431.

Cuan et al., "Adsorbate Induced Restructuring of $TiO_2$ (011)-(2x1) Leads to One-Dimensional Nanocluster Formation," *Physical Review Letters*, 108, 106105 (2012), pp. 1-5.

Silber et al., "Adsorbate-induced lifting of substrate relaxation is a general mechanism governing titania surface chemistry," *Nature Communications*, 7, 12888 (2016), pp. 1-6.

Skelton et al., "Interaction of liquid water with the rutile $TiO_2$ (110) surface," *Molecular Simulation*, 33, 4-5 (2007) pp. 379-389.

\* cited by examiner

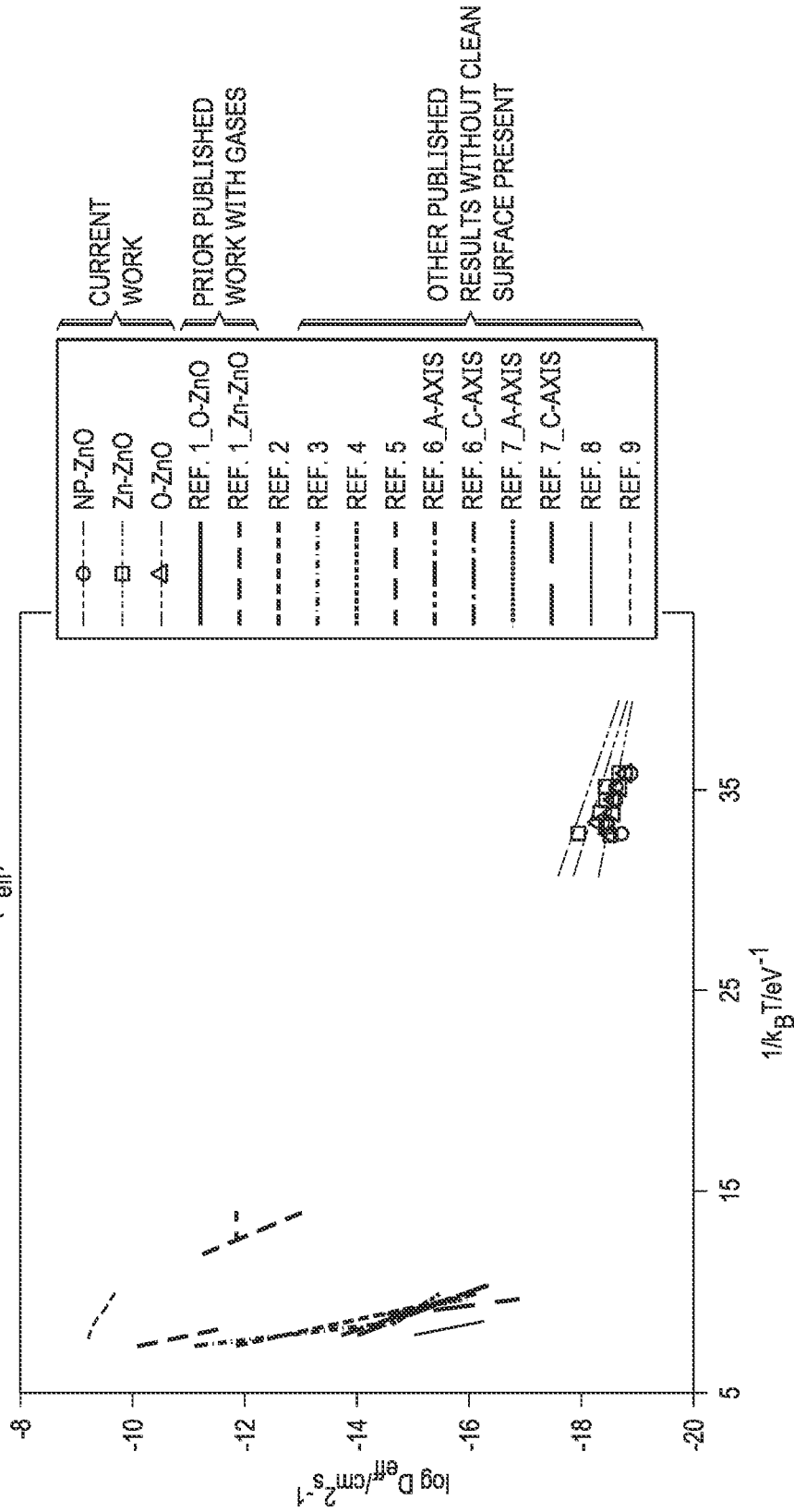

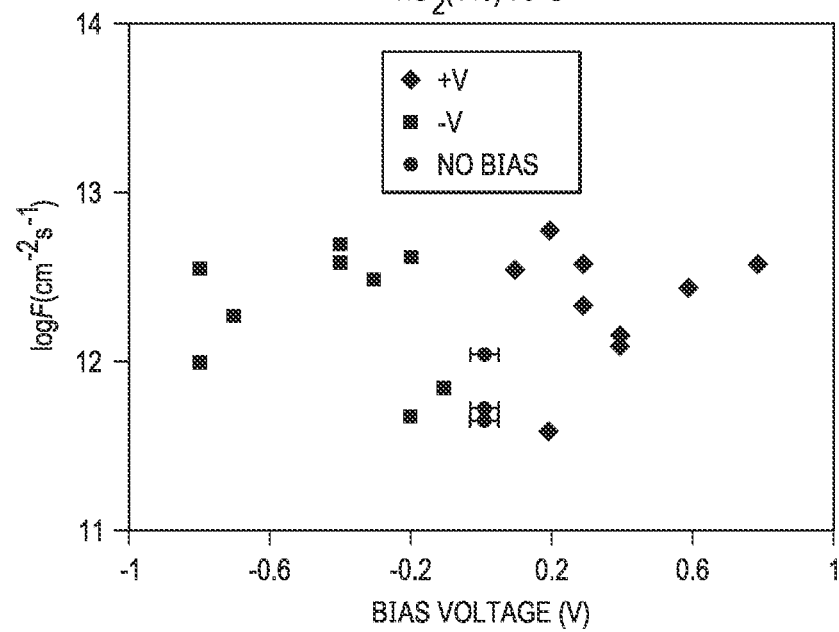

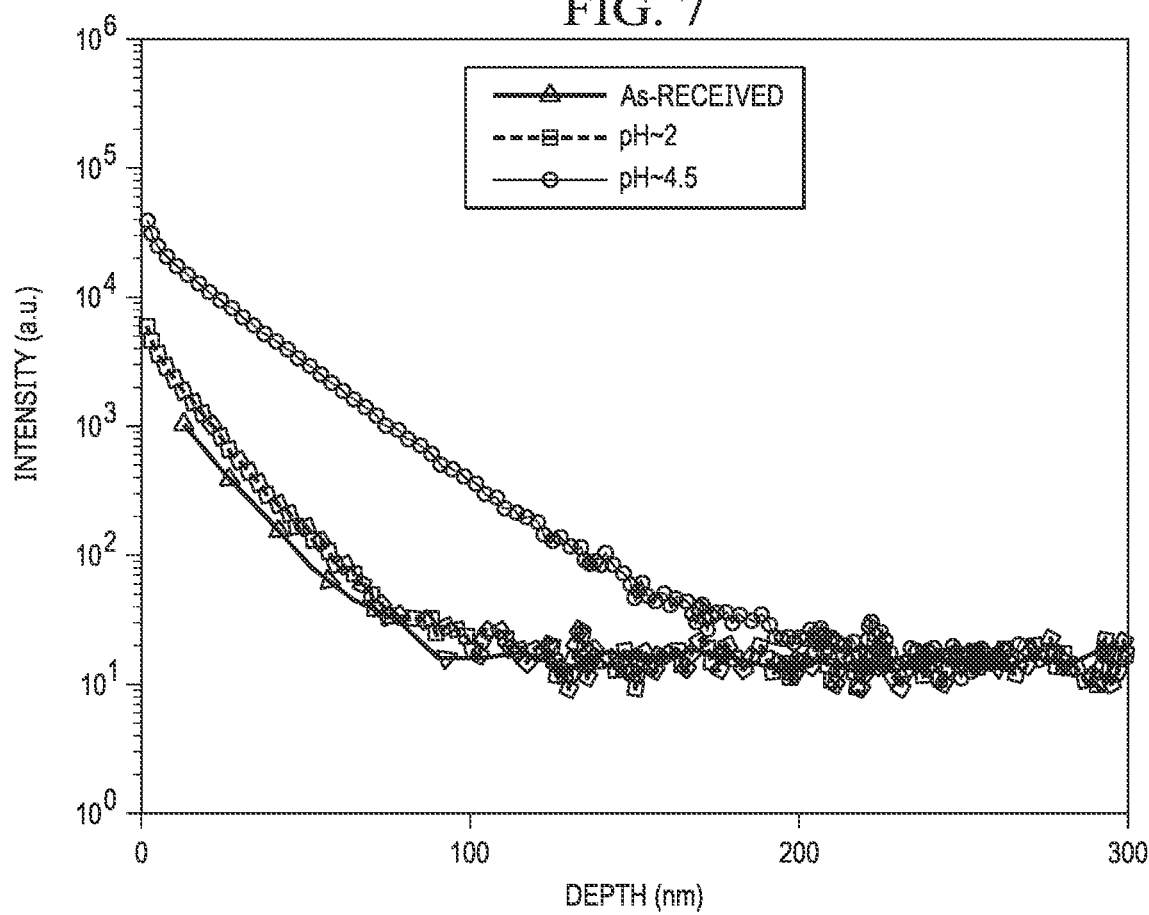

METHOD OF CONTROLLING OXYGEN VACANCY CONCENTRATION IN A SEMICONDUCTING METAL OXIDE

RELATED APPLICATION

The present patent document claims the benefit of priority under 35 U.S.C. 119(e) to U.S. Provisional Patent Application No. 63/137,971, which was filed on Jan. 15, 2021, and is hereby incorporated by reference in its entirety.

FEDERALLY SPONSORED RESEARCH OR DEVELOPMENT

This invention was made with government support under DMR 13-06822 and DMR 17-09327 awarded by the National Science Foundation (NSF). The government has certain rights in the invention.

TECHNICAL FIELD

The present disclosure is related generally to defect engineering and more specifically to controlling defects in semiconducting metal oxides.

BACKGROUND

Concentration and spatial distribution of oxygen vacancies ($V_o$) may influence a variety of technologically relevant aspects of commercially important binary oxide semiconductors (e.g., ZnO and $TiO_2$) and perovskites having the general formula $ABO_3$. For ZnO, those aspects may include parasitic green emission in ultraviolet emitters, photocarrier recombination rates in photocatalysts, ferromagnetism in spintronics, piezoelectricity in nanogenerators, and free electron density in p-n junctions. For $TiO_2$, those aspects may include electroforming in resistive memory devices, electrocatalysts of nanoparticles in ammonia production, photocatalysis in water splitting, anapole excitation in light harvesting, electrochemistry in energy storage, and wavelength selectivity in ultraviolet (UV) photodetectors. Perovskites currently find primary application in photovoltaic solar cells, but also have potential applications in sensors, catalyst electrodes, certain types of fuel cells, lasers, memory devices and spintronics. Synthesis methods for oxide semiconductors normally leave behind variable and often unpredictable concentrations of $V_o$, and at typical fabrication temperatures the vacancies exhibit minimal mobility. Oxygen interstitial atoms ($O_i$) move far more rapidly, however, and under oxygen-rich conditions may have more thermodynamic stability. Consequently, post-synthesis introduction of $O_i$ to eliminate $V_o$ or to adjust vacancy concentration more precisely would be advantageous for a broad array of applications in microelectronics, optoelectronics, photovoltaics, electrochemistry and photocatalysis.

BRIEF SUMMARY

A method of controlling oxygen vacancy concentration in a semiconducting metal oxide includes exposing a treated surface of a crystalline metal oxide to water at a temperature and pressure sufficient to maintain the water in a liquid phase. During the exposure, a portion of the water is adsorbed onto the treated surface and dissociates into atomic oxygen and hydrogen. The atomic oxygen is injected into and diffuses through the crystalline metal oxide, forming isolated oxygen interstitials and oxygen defect complexes. The isolated oxygen interstitials replace oxygen vacancies in the crystalline metal oxide.

BRIEF DESCRIPTION OF THE DRAWINGS

FIGS. 1B and 1D present the data on a normalized semi-logarithmic scale.

FIG. 3A plots log $D_{eff}$ versus $1/k_BT$ for Zn-terminated, O-terminated, and nonpolar ZnO treated surfaces exposed to liquid water to obtain oxygen injection in comparison with prior published gas-based experiments.

FIG. 6A plots mean net injection flux (F) for a (110) rutile $TiO_2$ surface exposed to liquid water for oxygen injection while under a bias voltage.

FIG. 6B plots mean diffusion length ($\lambda$) for a (110) rutile $TiO_2$ surface exposed to liquid water for oxygen injection while under a bias voltage.

FIG. 7 shows a metal cation (Mn) diffusion profile obtained from exposing a (110) rutile $TiO_2$ surface to an aqueous solution comprising $MnCl_2$ at two different levels of pH while under a bias voltage.

DETAILED DESCRIPTION

Figure 1A:
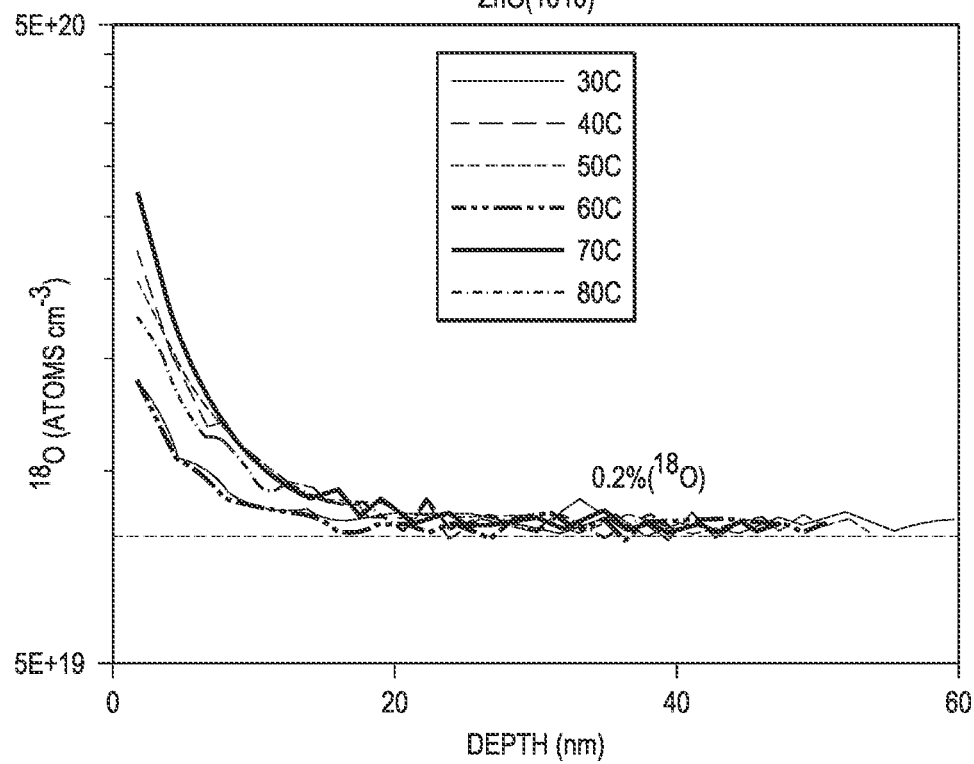
FIGS. 1A-1D show diffusion profiles of $^{18}O$ for the non-polar ($10\bar{1}0$) treated surface of ZnO and the non-polar (110) treated surface of $TiO_2$ upon exposure to $^{18}O$-labeled water, where

A liquid-based method of replacing oxygen vacancies with interstitial oxygen in a semiconducting metal oxide has been developed. As indicated above, control over the concentration and spatial distribution of oxygen vacancies in oxide semiconductors may enable advances in fields ranging from photocatalysis to optoelectronics. In contrast to a previous gas-based method of manipulating vacancy concentration that utilizes elevated temperatures (e.g., >500° C.) and very low pressures (e.g., <$10^{-4}$ Torr), the new method can inject atomic oxygen into oxide semiconductors at relatively low temperatures and atmospheric pressure, thereby reducing hurdles toward manufacturability. Fast injection may require removal of monolayer-level surface contaminants and the elimination of bonds between adsorbed oxygen atoms and any species other than the oxide semiconductor surface.

The method entails exposing a treated surface of a crystalline metal oxide comprising oxygen vacancies to liquid water at a temperature and pressure sufficient to maintain the water in a liquid phase. In one example, the temperature is less than 100° C. and the pressure is atmospheric pressure. The water may include $H_2O$, $H_2{}^{18}O$ (where $^{16}O$ is replaced with $^{18}O$), and/or $^2H_2O$ (where $^1H$ is replaced with $^2H$). The treated surface may be understood to be an atomically-clean or substantially poison-free surface of the metal oxide semiconductor, as will be discussed later. During the exposure, some amount of the water is adsorbed onto the treated surface and dissociates into atomic oxygen (e.g., $^{16}O$ and/or $^{18}O$) and hydrogen. The atomic oxygen is injected into and diffuses through the crystalline metal oxide, forming isolated oxygen interstitials as well as defect complexes. Injection may be promoted with a bias voltage or with ultraviolet radiation, as discussed below. The isolated oxygen interstitials may replace or "annihilate" the oxygen vacancies in the crystalline metal oxide. Beneficially, dissociation of the liquid water on the treated surface does not lead to incorporation of hydrogen, which is typically an unwanted species, into the crystalline metal oxide. Typically, the crystalline metal oxide may include a vacancy concentration on the order of $1 \times 10^{16}$ cm$^{-3}$ prior to the method, and all or substantially all (e.g, greater than 99%) of the oxygen vacancies over a predetermined depth may be annihilated by the oxygen interstitials, such that $O_i$ becomes the majority oxygen-related native point defect.

The exposure to the liquid water may take place for a time duration sufficient for diffusion of the atomic oxygen into the crystalline metal oxide to occur (e.g., to the predetermined depth), after which the exposure of the treated surface to the liquid water may be halted. Typically, the diffusion profile may be approximated by $x^2 = 6Dt$, where x represents distance (e.g., the predetermined depth referred to above), D represents diffusion coefficient, and t represents time duration of the exposure to liquid water. Typically, the time duration is in a range from about 10 min to about 120 min, or from about 30 min to about 90 min. Generally speaking, however, the time duration may be at least about 10 min and as high as several days, e.g., up to about 100 hours, which can significantly impact the distance traveled by the oxygen interstitials, as discussed further below.

The crystalline metal oxide may be described as being single-crystalline (monocrystalline) or polycrystalline. In examples in which the crystalline metal oxide is single-crystalline, the crystalline metal oxide may exhibit a crystal lattice structure that is devoid of grain boundaries. Typically, the crystalline metal oxide comprises a semiconducting metal oxide such as $TiO_2$, ZnO, $Ga_2O_3$, $SrTiO_3$, $SnO_2$, $In_2O_3$, ITO, $WO_3$, $Cr_2O_3$, CuO, $Co_2O_3$ and/or a perovskite having the general formula $ABO_3$, where A and B are metal cations such as Ti, Zn, Ga, Sr, Sn, In, W, Cr, Cu and/or Co. In some examples, the crystalline metal oxide may include a dopant such as Al, As, Ce, Er, Fe, Ga, Mg, N, P, Sb and/or Y. Also or alternatively, the crystalline metal oxide may have at least one linear dimension of about 1 micron or less, or about 100 nm or less, e.g., the crystalline metal oxide may take the form of a thin film having a thickness of about 1 micron or less, or about 100 nm or less. Alternatively, the crystalline metal oxide may comprise a nanorod or nanoparticle having two or more linear dimensions of about 1 micron or less, or about 100 nm or less.

Notably, the atomic oxygen injected from the surface is believed to be a mobile species comprising oxygen interstitials ($O_i$) rather than oxygen vacancies ($V_o$) or another oxygen-containing complex. (The terms "oxygen interstitials," "interstitial oxygen," and "$O_i$" are used interchangeably throughout this disclosure.) Evidence for this includes diffusion mechanism changes for exemplary metal oxide crystals ($TiO_2$, ZnO and $Ga_2O_3$ in these examples) that signify a mobile intermediate that is not $V_o$. For example, exponential profile shapes on a normalized scale and measured values for effective diffusity ($D_{eff}$) exceed those for $V_o$ mediation by 2-8 orders of magnitude and are consistent with values predicted by $O_i$. Literature quantum calculations predict $O_i$ to have a lower formation enthalpy than $V_o$ under the experimental conditions. The impact of the surface on diffusion is illustrated by diffusion data for ZnO, where diffusion parameters discussed below ($D_{eff}$, λ and F) may vary depending on the surface (e.g., c-axis Zn-terminated and O-terminated, and a-axis nonpolar).

The oxygen interstitials are mobile enough even at room temperature to find a defect or species, in addition to oxygen vacancies, to react or complex (i.e., sequester) with. The defect complexes may include native cation vacancies or interstitials, adventitious hydrogen, extended defects, or other species. In other words, the defect complexes formed by the injection of atomic oxygen into the crystalline metal oxide may include interstitial oxygen ($O_i$) and a metal cation vacancy ($V_M$), a metal cation interstitial ($M_i$), hydrogen (H), and/or an extended defect, such as an edge dislocation. Examples of oxygen defect complexes include $O_i$—H, $O_i$—$V_M$, and/or $O_i$-$M_i$, where M represents a metal cation such as, but not limited to, Ti, Zn, Ga, Sr, Sn, In, W, Cr, Cu and/or Co. The concentration of $O_i$ may be quite low (with the concentration of $V_o$ being even lower), and may depend upon how tightly the $O_i$ are bound to the various kinds of sequestration sites that are available. Given the relatively low process temperatures of the liquid-based method compared to prior gas-based methods, different defect complexes may be formed by the dissociation of liquid water on the treated surface. In particular, $O_i$ may form complexes with hydrogen (the $O_i$—H complexes mentioned above) that were not previously known to exist as stable complexes in ZnO and $TiO_2$.

The presence of $O_i$—H complexes can have a drastic effect on the properties of a semiconducting metal oxide by converting hydrogen to an acceptor of electrons. Atomic hydrogen, which is often unavoidably incorporated within metal oxide semiconductors during synthesis, typically acts as a positively-charged donor of electrons, thereby adding unintentional n-type character to the semiconducting metal oxide and inhibiting fabrication of p-type semiconducting devices. However, the $O_i$—H defect complexes formed upon $O_i$ injection may act as negatively-charged acceptors of electrons, promoting p-type behavior. Advantageously, $O_i$—H complexes may exist as electron acceptors over ranges of electronic conditions at which H would otherwise exist as an electron donor. Thus, controllable $O_i$ injection, which can annihilate oxygen vacancies in parallel with forming defect complexes, may be technologically more important in crystalline metal oxides where the concentration of hydrogen exceeds that of oxygen vacancies.

The activation energy or injection barrier for the incorporation of oxygen interstitials into the subsurface of $TiO_2$ and ZnO if found to lie only 0.1-0.2 eV above the lattice site-hopping barrier, which itself is 1 eV or less. These values allow for technologically useful injection rates near room temperature. For example, the lattice site-hopping barriers for $O_i$ in a-axis ZnO and $TiO_2$ are about 0.6 eV and 0.9 eV, respectively. It is believed that small injection barriers may be found for a wide variety of metal oxides, not just for $TiO_2$ and ZnO. Hopping barriers of 1 eV or less together with injection barriers exceeding the hopping barriers only slightly may enable diffusion lengths of tens to thousands of nanometers at only a few tens of degrees above room temperature (e.g., 30° C. to <100° C.). It is believed that significant incorporation of interstitial oxygen can occur in this temperature range if the water exposure yields adsorbed oxygen and if co-adsorbates do not poison incorporation sites or raise the injection barrier. Generally speaking, the activation energy or injection barrier appears to be influenced by the type of metal oxide, presence of neighboring adsorbates, charge state of the O defect, and surface reconstruction. The depth of $O_i$ penetration may depend on the type of metal oxide, charge state of the oxygen defect, and/or the concentration of sequestration sites, as well as how strongly the $O_i$ bonds to these sites.

Figure 1B:
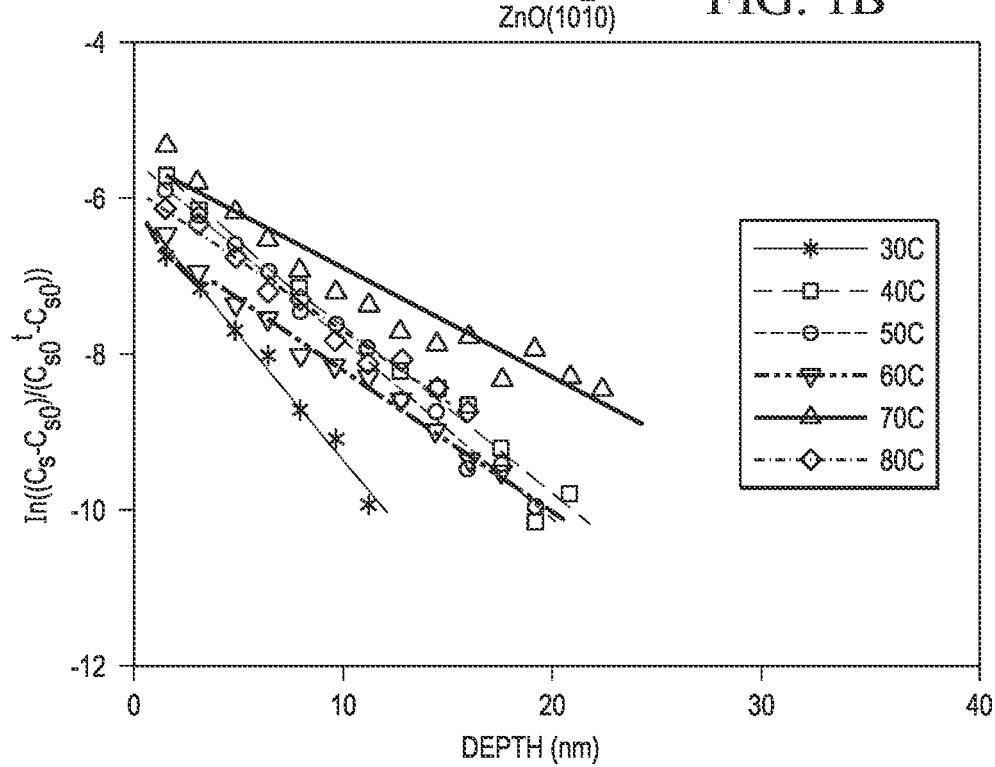
Figure 1C:
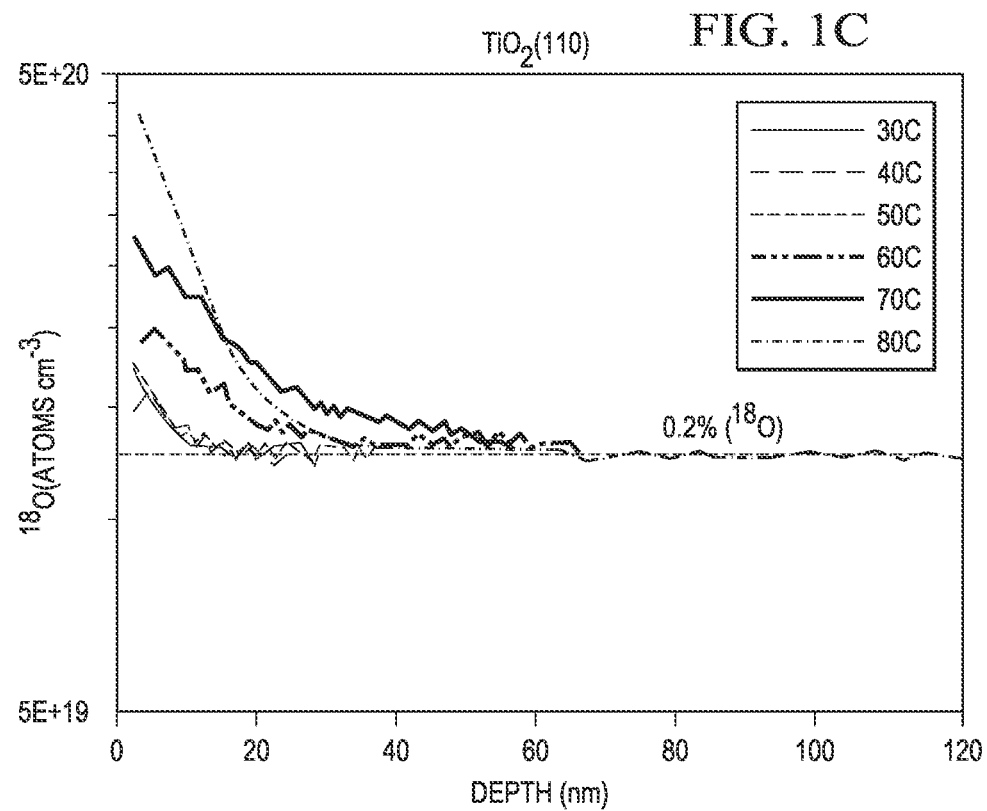
Figure 1D:
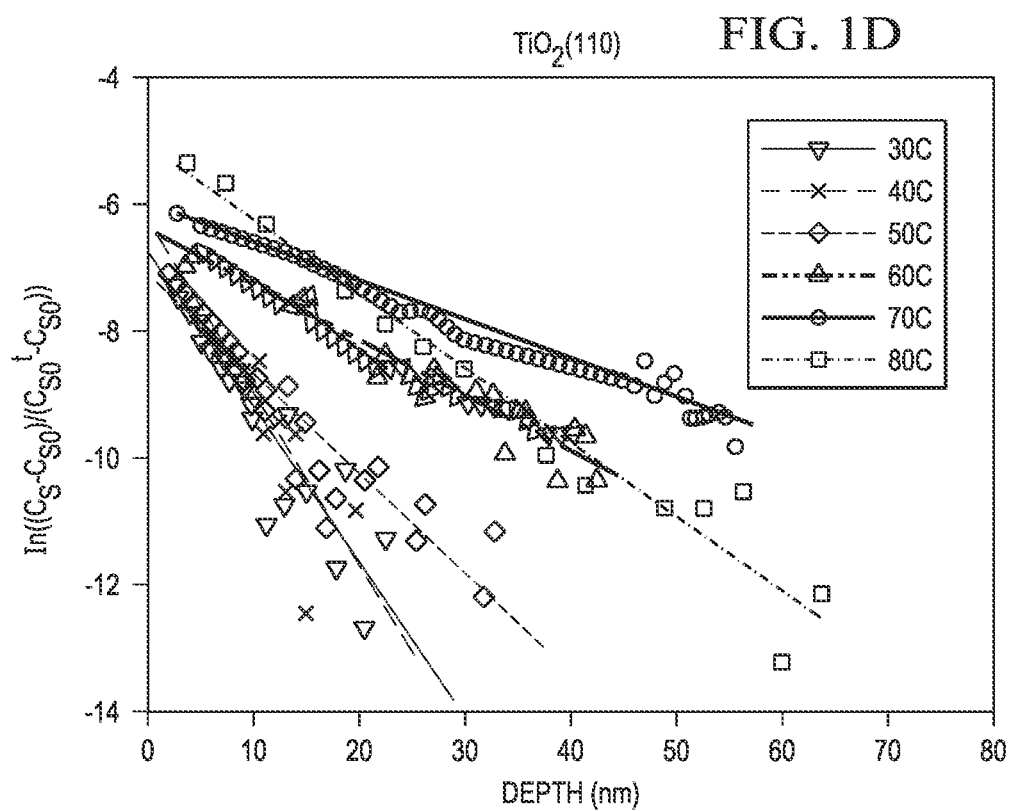
Figure 1E:
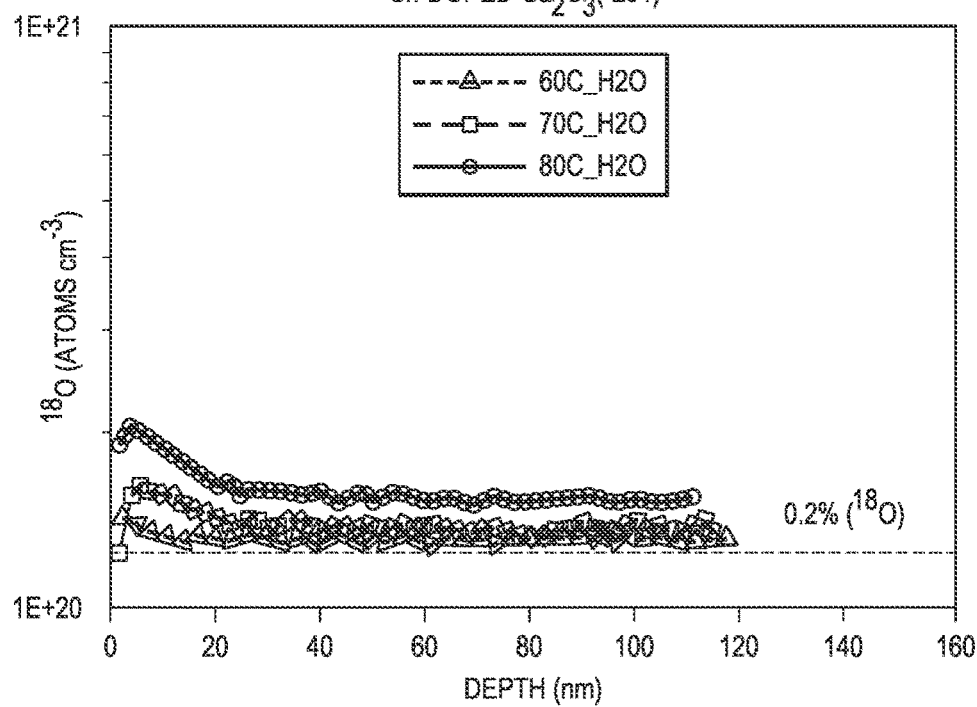
FIG. 1E shows a diffusion profile of $^{18}O$ for the (−201) treated surface of Sn-doped $Ga_2O_3$ upon exposure to $^{18}O$-labeled water.

Isotopic oxygen self-diffusion experiments confirm the injection and diffusion of a mobile oxygen defect into $TiO_2$, ZnO, and $Ga_2O_3$ single crystals when the treated surface is exposed to liquid water as described above. FIGS. 1A-1D show diffusion profiles of $^{18}O$ for the non-polar $(10\bar{1}0)$ treated surface of ZnO and the non-polar (110) treated surface of $TiO_2$ upon exposure to $^{18}O$-labeled water at temperatures from 30° C. to 80° C. under 1 atm of pressure for 60 minutes. FIGS. 1B and 1D present the diffusion data of FIGS. 1A and 1C, respectively, on a normalized semi-logarithmic scale. FIG. 1E shows comparable diffusion profiles for the (−201) treated surface of Sn-doped $Ga_2O_3$ upon exposure to $^{18}O$-labeled water at temperatures from 60° C. to 80° C. under 1 atm of pressure for 60 minutes.

Figure 2A:
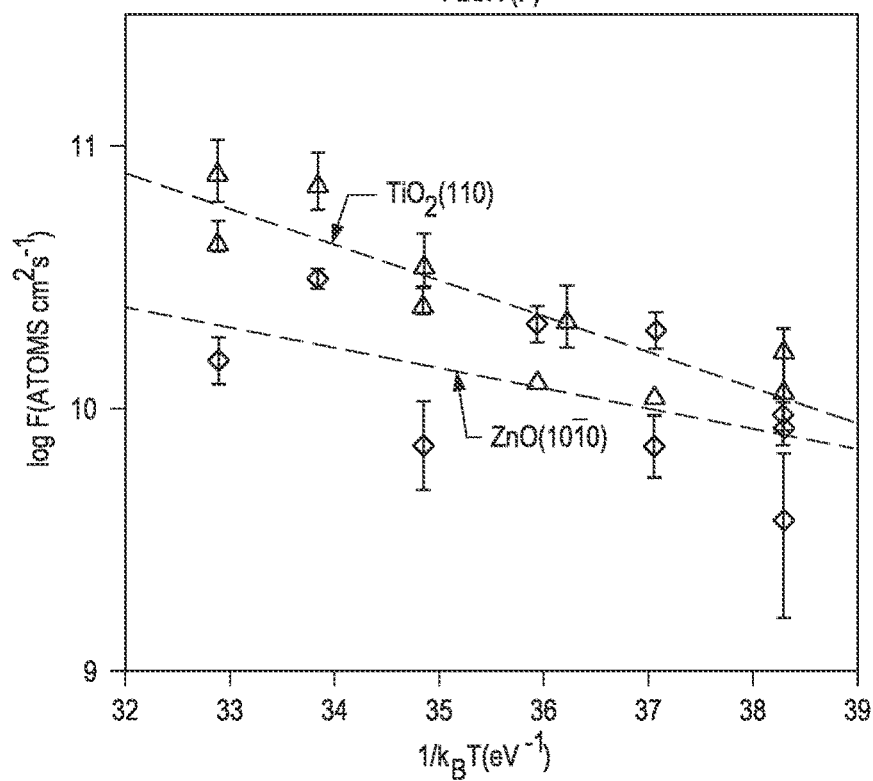
FIGS. 2A-2C show Arrhenius plots of net injection flux (F), mean diffusion length ($\lambda$), and effective diffusivity ($D_{eff}$) based on the $^{18}O$ diffusion profiles measured for ZnO ($10\bar{1}0$) and $TiO_2$ (110).
Figure 2B:
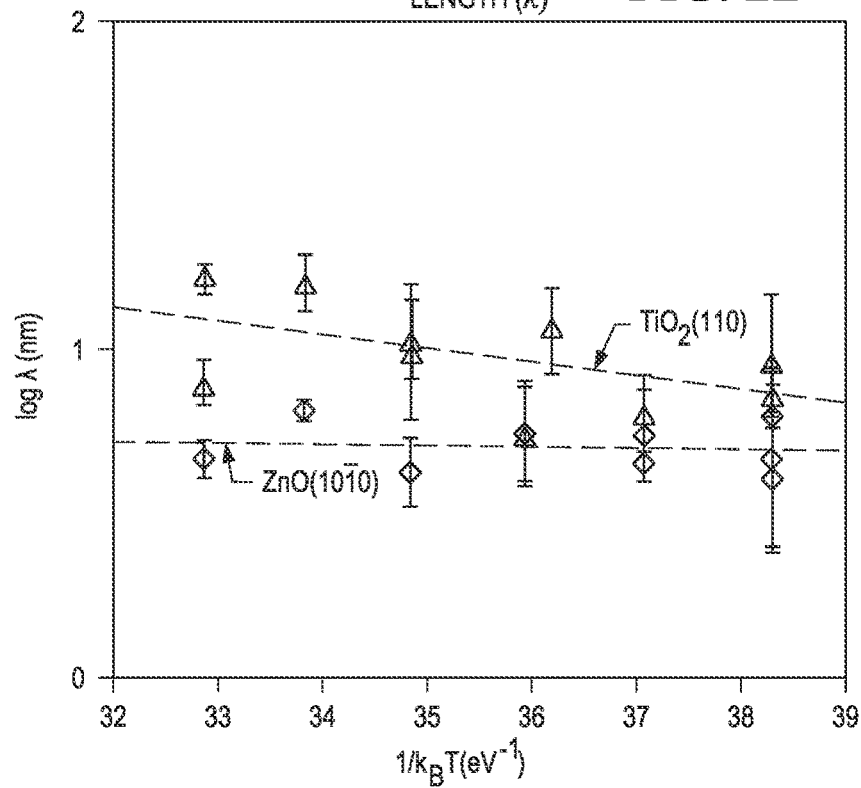
Figure 2C:
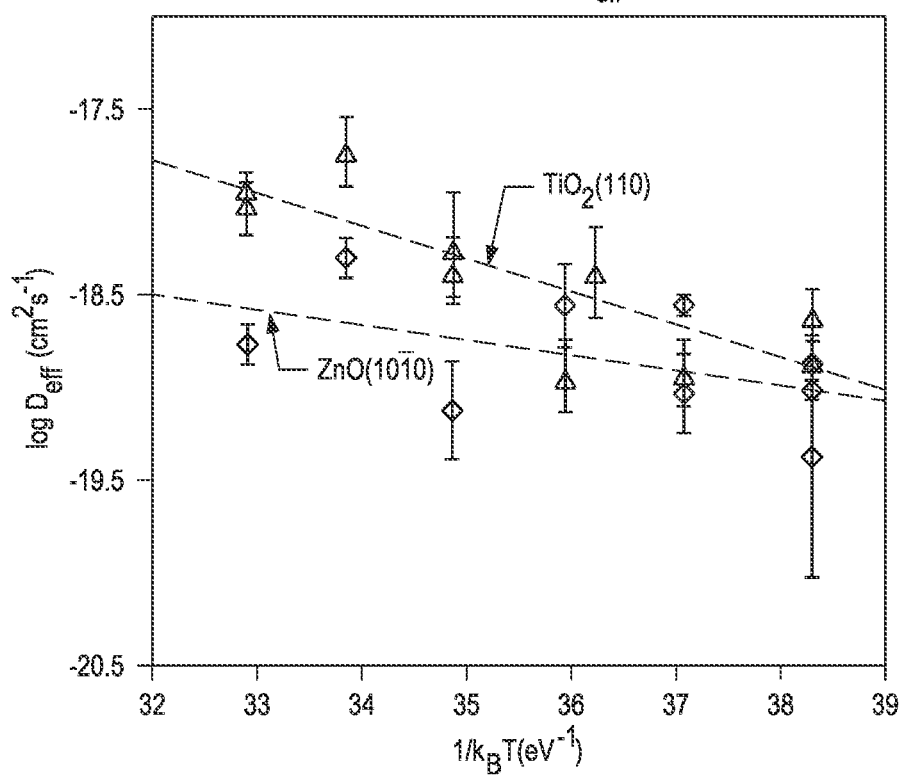
Figure 2D:
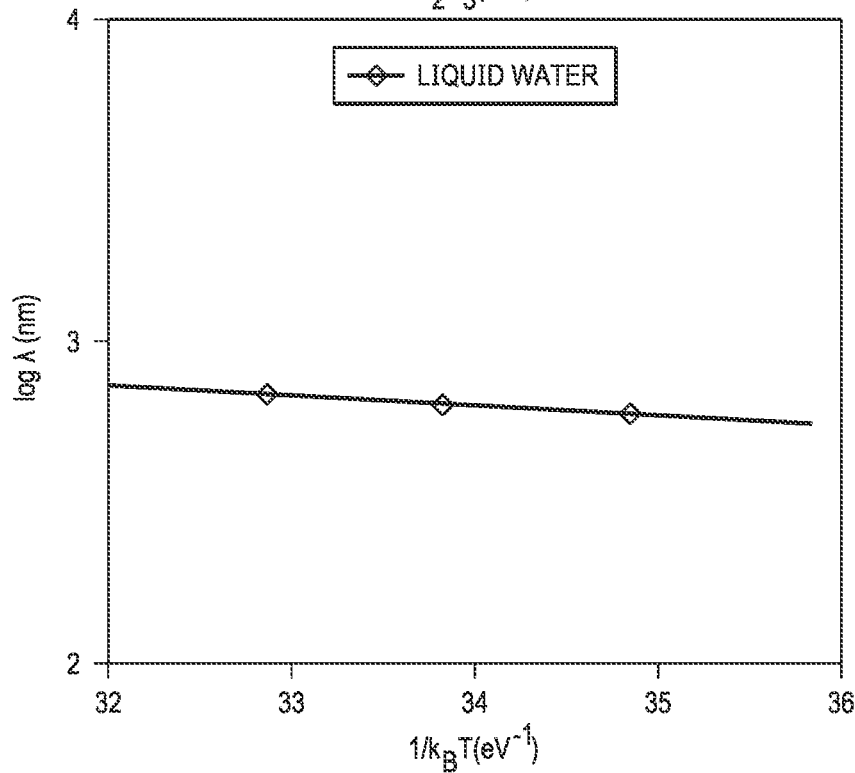
FIGS. 2D-2F show Arrhenius plots of F, $\lambda$, and $D_{eff}$ based on $^{18}O$ diffusion profiles measured for $Ga_2O_3$ (100).
Figure 2E:
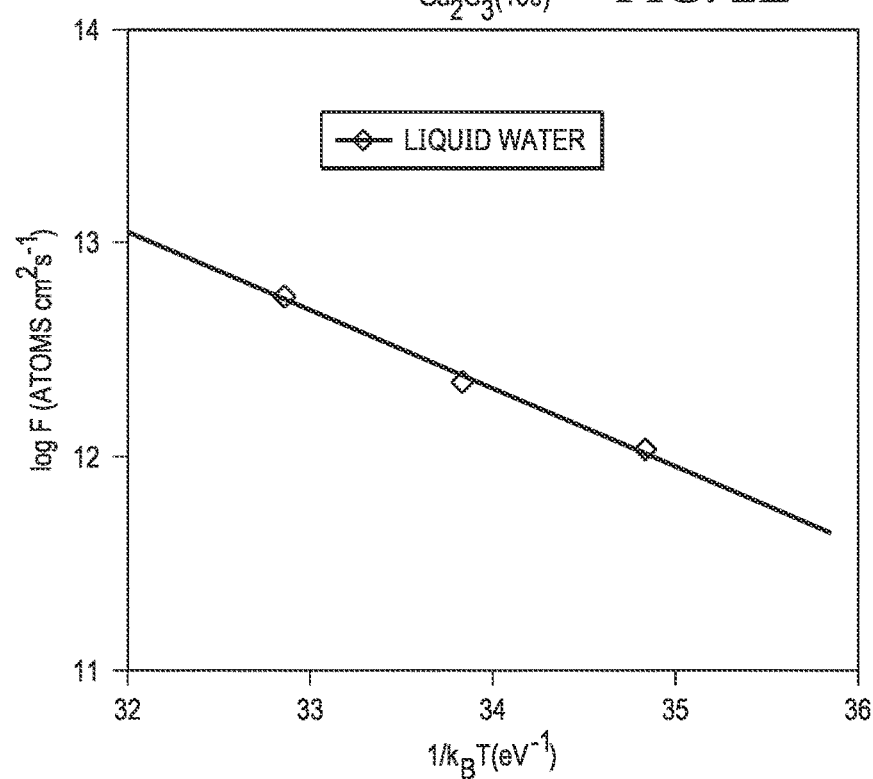
Figure 2F:
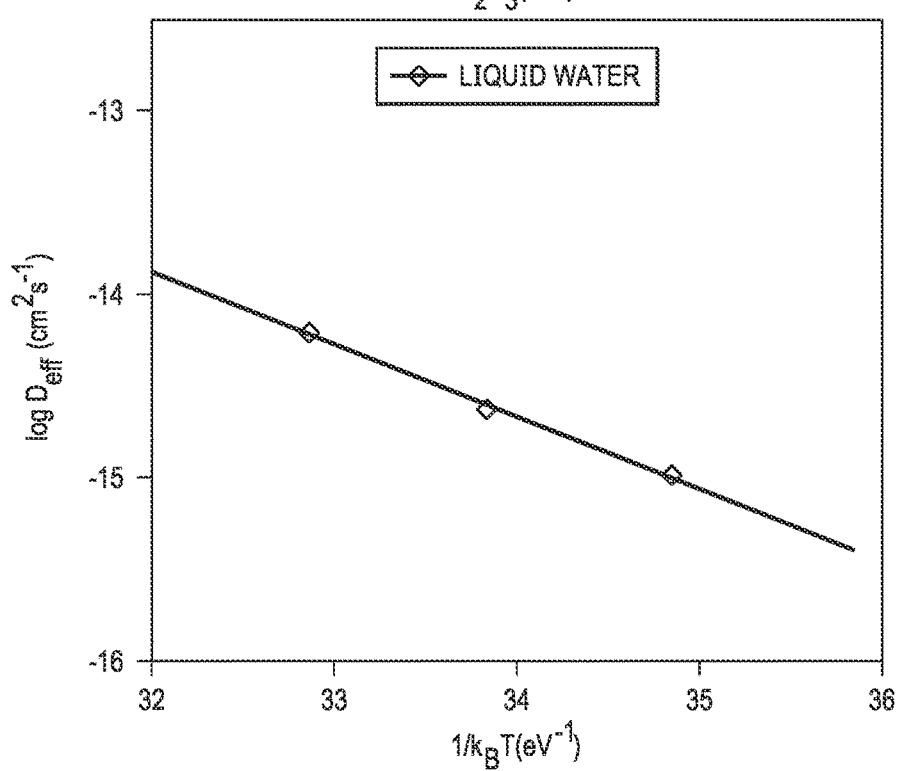

The isotopic concentration profiles yield composite parameters including several physical effects. Referring again to FIGS. 1B and 1D, net injection flux (F) of the mobile defect can be determined from the y-axis intercept and mean diffusion length ($\lambda$) can be determined from the slope of the concentration profiles. The effective diffusivity ($D_{eff}$) for use in a standard diffusion equation can be computed from F and $\lambda$. Net injection flux provides insight into the rate at which the treated surface creates mobile $O_i$, and the mean diffusion length provides insight into the immobilization of mobile $O_i$ by bonding to sequestration sites in the crystalline metal oxide. FIGS. 2A-2C show Arrhenius plots of net injection F, $\lambda$, and $D_{eff}$ based on the $^{18}O$ diffusion profiles measured for ZnO $(10\bar{1}0)$ and $TiO_2$ (110), and FIGS. 2D-2F show Arrhenius plots of F, $\lambda$, and $D_{eff}$ based on $^{18}O$ diffusion profiles measured for $Ga_2O_3$ (100).

Figure 3B:
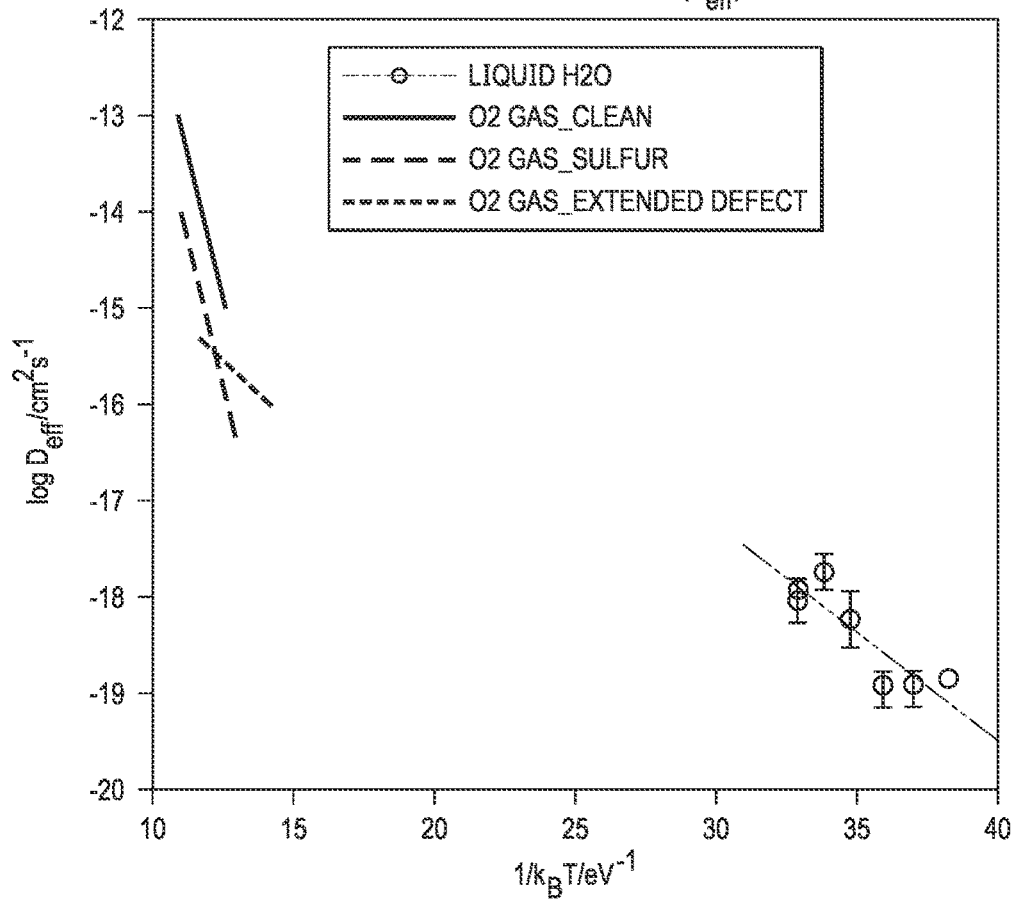
FIG. 3B plots log $D_{eff}$ versus $1/k_BT$ for $TiO_2$ treated surfaces exposed to liquid water to obtain oxygen injection in comparison with prior published gas-based experiments.

Diffusion upon exposure to liquid water is found to be vastly faster than would be extrapolated from prior published gas-based work of the inventor on clean surfaces ("ref. 1") and even more so in comparison with others that include monolayer levels of surface contamination ("refs. 2-9"), as illustrated in FIG. 3, which plots log $D_{eff}$ versus $1/k_BT$ for Zn-terminated (Zn—ZnO (0001)), O-terminated (O—ZnO (000$\bar{1}$)), and nonpolar (NP—ZnO $(10\bar{1}0)$) ZnO surfaces. Analogous data are shown in FIG. 3B for $TiO_2$ (110). The blue, yellow and red curves represent prior published gas-based diffusion data from the inventor for clean, sulfur-poisoned (0.1 monolayer of adsorbed sulfur), and Ti-enriched defective $TiO_2$ (110) surfaces, respectively.

Figure 4A:
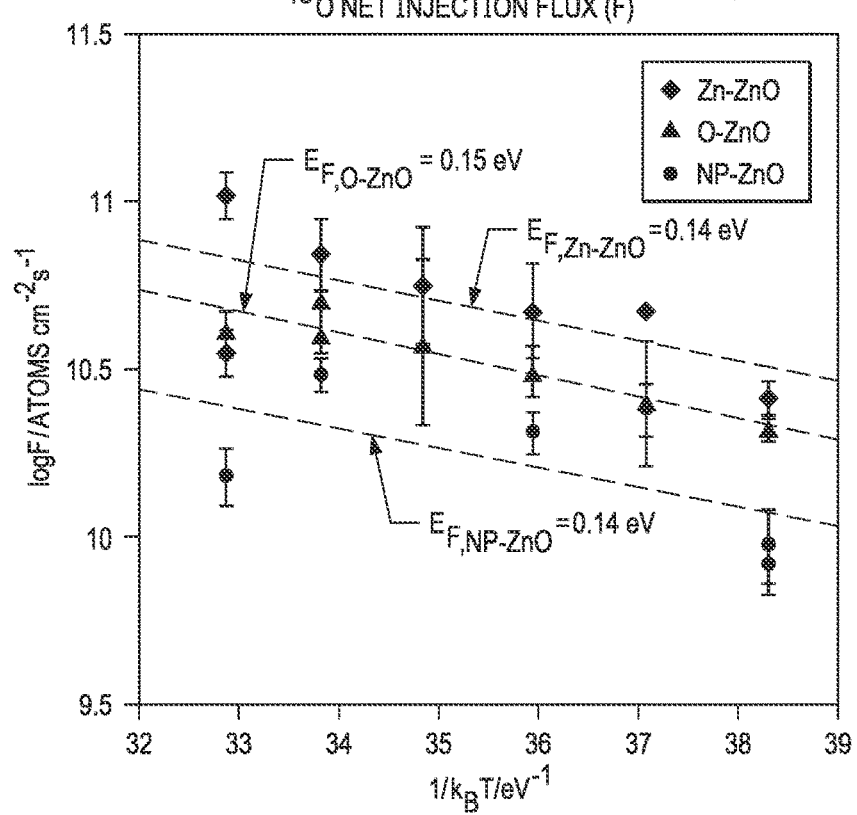
FIG. 4A plots net injection flux (F) as a function of $1/k_BT$ for the Zn-terminated, O-terminated, and nonpolar ZnO treated surfaces exposed to liquid water for oxygen injection.
Figure 4B:
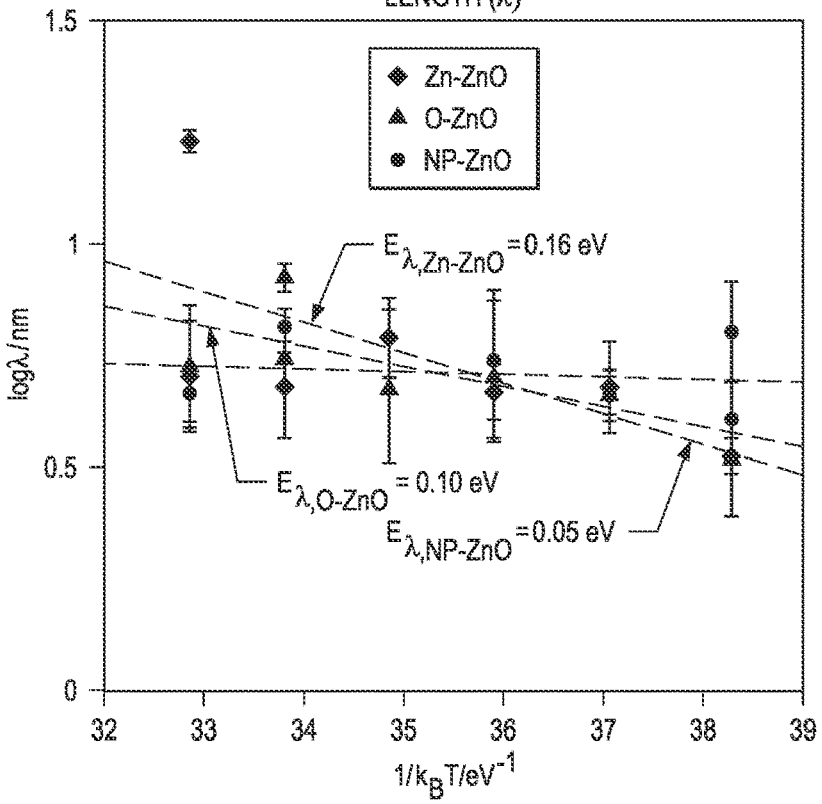
FIG. 4B plots mean diffusion length ($\lambda$) as a function of $1/k_BT$ for the Zn-terminated, O-terminated, and nonpolar ZnO treated surfaces exposed to liquid water for oxygen injection.

Different crystallographic orientations of the crystalline metal oxide yield different atomic structures at the treated surface. The explanation for the faster diffusion rate may stem from surface cleanliness and the nature of the solid sequestration sites. As shown in FIG. 4A for ZnO, F varies slightly with crystallographic orientation, which demonstrates the key role of the treated surface in determining behavior. However, the variations are modest and are not expected to complicate possible manufacturing processes. Notably $\lambda$ is a bulk property of the crystalline metal oxide and remains substantially unaffected by orientation, as shown by the data of FIG. 4B.

As evidenced by the logarithmic concentration profiles (e.g., FIGS. 1B and 1D), some amount of the atomic oxygen may diffuse within the crystalline metal oxide to a depth of tens of nanometers, e.g., about 20 nm or more in the example of ZnO, and about 60 nm or more in the example of $TiO_2$, where greater diffusion depths may be correlated to higher temperatures of liquid water exposure. Preferably, the atomic oxygen may diffuse to depths up to about 50 nm or higher, up to about 65 nm or higher, or up to about 80 nm or higher, depending on the metal oxide, temperature of exposure, and/or time duration of exposure. For long time durations of liquid water exposure (e.g., at least 10 h, and up to or greater than 100 h), the diffusion depth may reach 300-1,000 nm in crystalline metal oxides such as ZnO and $TiO_2$. In $Ga_2O_3$, which is of interest for high-power electronics, $O_i$ may diffuse nearly 3,000 nm at 60-80° C. with at least 1 h of liquid water exposure, which suggests that diffusion of about 30,000 nm (30 microns) may be achieved within 100 h of exposure time. It is believed there are few or no sequestration sites for the $O_i$ in $Ga_2O_3$, and also that the $O_i$ diffuse with a small activation barrier of 0.2 eV, such that diffusion over nearly macroscopic distances may be achieved. This suggests that the depth to which the oxygen interstitials can diffuse may depend on the type and concentration of sequestration sites available in the crystalline metal oxide. Generally speaking, diffusion depths of at least about 20 nm and up to 30 microns may be achievable depending on the time duration and temperature of liquid water exposure, the type of metal oxide, the type and concentration of sequestration sites, and possibly other factors. For some crystalline metal oxides, such as ZnO and $TiO_2$, the diffusion depths may typically range from about 20 nm to about 1,000 nm (1 micron). For other crystalline metal oxides, such as $Ga_2O_3$, the diffusion depths may typically range from about 1 micron to about 30 microns.

It is postulated that greater diffusion depths may be achieved by exposing the treated surface of the crystalline metal oxide to liquid water at a temperature above 100° C. and at a pressure greater than 1 bar (100 kPa), where the pressure is sufficient to keep the water in the liquid phase at the selected temperature and the temperature is high enough to enhance diffusion. For example, the temperature of the liquid water may be in a range from about 150° C. to about 250° C. when the pressure is in a range from about 10 bar (1 MPa) to about 20 kbar (2 GPa). At such elevated temperatures, oxygen interstitials injected into the crystalline metal oxide may penetrate to greater diffusion depths, such as a diffusion depth of 100 nm or greater, 1 micron or greater, 10 microns or greater, or even 100 microns or greater. The enhanced diffusion may be due at least in part to the lower stability of defect complexes at the elevated temperatures, as such complexes can sequester oxygen interstitials and consequently inhibit their mobility. After the exposure of the treated surface to the elevated temperature (>100° C.) and pressure conditions (>1 bar), the temperature may be gradually quenched below 100° C. and the pressure reduced to atmospheric conditions, at which point defect complexes rendered unstable at elevated temperatures may form in the crystalline metal oxide. Both the oxygen interstitials and defect complexes may be distributed at greater depths following the above-described high pressure process.

As indicated above, the method is carried out using a treated surface. Low bond coordination of surface atoms relative to bulk atoms facilitates creation or destruction of point defects on atomically-clean crystalline metal oxides. Suitably treated surfaces offer a means for manipulating the populations of bulk defects, most notably for materials such as semiconductors where defects may significantly influence technologically relevant material properties. The removal of strongly bonded adsorbates, such as carbon and/or sulfur on $TiO_2$ or ZnO, is deemed critical for manipulating defect populations. Even in at coverages well below one monolayer, such adsorbates may prove capable of poisoning the kinetic pathways responsible for defect exchange between the surface and bulk. Other adsorbates, such as water, atomic hydrogen, and sodium and/or chlorine from dissolved NaCl, may adsorb onto the surface but may not act as poisons (e.g., by interfering with the isotopic profiles).

Accordingly, the treated surface is preferably an atomically-clean or substantially poison-free (contaminant-free) surface of the metal oxide semiconductor. Ideally, the treated surface includes a concentration of impurity species of 0.01 ML (about 1% of a monolayer) or less. In some cases, the concentration of impurity species may be about 0.005 ML or less, or as low as about 0.001 ML. The treated surface may comprise a polar or non-polar surface, where, in the former case, the polar surface may be cation- or anion-terminated, as in the examples described above.

A method to prepare a suitably treated surface has been developed. The method includes degreasing a surface of the crystalline metal oxide, followed by wet etching of the surface and/or vacuum annealing of the crystalline metal oxide. The degreasing may comprise exposing the surface to acetone, isopropyl alcohol, ethanol and/or methanol by, for example, immersion in an ultrasonic bath. Vacuum annealing may entail heating the surface at a temperature in a range from about 400° C. to about 550° C. at an oxygen pressure $P_{O2}$ in a range from about $1 \times 10^{-6}$ Torr to about $1 \times 10^{-4}$ Torr. Typically, the heating is carried out from 30 minutes to 24 hours. A vacuum annealing treatment in $O_2$ at 500° C. for 6 h is employed to prepare the treated surface of the $Ga_2O_3$ described above in reference to FIG. 1E. The wet etching, when employed to prepare the treated surface, may comprise exposing the surface to hydrogen peroxide ($H_2O_2$) and/or ammonium hydroxide ($NH_4OH$) under suitable conditions, as described below for ZnO and $TiO_2$.

Aqueous $H_2O_2$ may serve as an oxidant through formation of the hydroperoxide ion $HO_2^-$ and is also acidic. Single-crystalline ZnO may be readily etched by $H_2O_2$ as well as by either acidic or basic solutions. Foreign adsorbates may become soluble either by dissolution of the zinc oxide or by direct oxidation. Relatively high etching temperatures (e.g., 70-80° C.) may be required to obtain optimal behavior, although such temperatures may lead to increased surface roughening.

Exemplary aqueous wet etching solutions for single-crystalline ZnO (e.g., ZnO (0001)) are described in Table 1 below. For example, exposing a ZnO surface to an aqueous solution comprising 5-20% $H_2O_2$ for 5-20 min at a temperature in the range of 25-80° C. may be effective. Preferably, the aqueous solution comprises 10-20% $H_2O_2$ for 10-20 min at a temperature of about 70-80° C.

TABLE 1

Exemplary ZnO Wet Etching Solutions and Conditions

| Solution | Solution composition | Time (min) | Temperature (° C.) |
|---|---|---|---|
| Hydrogen peroxide | 10% $H_2O_2$ | 5, 10, 20 | 25, 80 |
| | 20% $H_2O_2$ | 5, 10, 20 | 25, 80 |
| | 30% $H_2O_2$ | 5, 10, 20 | 25, 80 |
| Ammonia | 1:2 of 30% $NH_4OH:H_2O$ | 40 | 25 |

In contrast, $H_2O_2$ is not found to prove effective as a wet etchant for enhancing injection into single-crystalline $TiO_2$. Mineral acids such as phosphoric acid ($H_3PO_4$), sulfuric acid ($H_2SO_4$), and hydrofluoric acid (HF) can readily etch $TiO_2$; however, these also may not be beneficial for preparing the treated surface of $TiO_2$ since they may lead to deposition of unwanted foreign elements or adsorbates. $NH_4OH$ and related bases such as NaOH and $Na_3PO_4$ all exhibit a small but nonzero ability to dissolve $TiO_2$, with $Na_3PO_4$ being an order of magnitude more active than NaOH, which in turn is an order of magnitude more active than $NH_4OH$. However, $NH_4OH$ is preferred because of the potential of desorbing the cation as $NH_3$, thereby lessening the possibility of leaving behind foreign elements. Indeed, $NH_4OH$ does prove effective as a wet etchant for $TiO_2$, presumably by the mechanism of simple dissolution of the titanium dioxide since the wet etchant exhibits no special capability for oxidation. Notably, the efficacy is found to be diminished by the addition of $H_2O_2$ either together with the $NH_4OH$ or in sequence after it.

Exemplary aqueous wet etching solutions for single-crystalline $TiO_2$ (e.g., $TiO_2$ (110)) are described in Table 2 below. For example, exposing a $TiO_2$ surface to an aqueous solution comprising $NH_4OH$ for 30-50 min at a temperature of 25-30° C. or, more preferably, to an aqueous solution comprising 1:2 of 30% $NH_4OH:H_2O$ for 40 min at a temperature of 25° C. may be effective. Etchants based on phosphoric acid ($H_3PO_4$) are also examined, but these are found by subsequent chemical characterization to deposit significant quantities of phosphorous. Since adsorbed sulfur is known to impede oxygen exchange in $TiO_2$ and ZnO, a similar inhibition is expected for phosphorous.

TABLE 2

Exemplary $TiO_2$ Wet Etching Solutions and Conditions

| Solution | Solution composition | Time (min) | Temperature (° C.) |
|---|---|---|---|
| Hydrogen peroxide | 5% $H_2O_2$ | 5, 10, 20 | 25 |
| | 10% $H_2O_2$ | 5, 10, 20 | 25 |
| Ammonia | 1:2 of 30% $NH_4OH:H_2O$ | 40 | 25 |
| Base piranha | 3:1 of 30% $NH_4OH$:30% $H_2O_2$ | 40 | 60 |
| Sequential ammonia-peroxide | 30% $NH_4OH$ → 30% $H_2O_2$ → $H_2O$ rinse | 20 min each step | 25 |
| Phosphoric acid | 85% $H_3PO_4$ | 10, 20, 40 | 80 |

Broadly speaking, the wet etchants investigated as described in the above tables involve aqueous solutions of $H_2O_2$, $NH_4OH$, or combinations of the two at various concentrations and temperatures. A final rinsing with deionized water is also possible, as shown in the table for a sequential etch employing $NH_4OH \rightarrow H_2O_2 \rightarrow H_2O$.

Isotopic exchange experiments show that high-temperature annealing in vacuum and wet etching are capable of opening pathways for defect exchange. The efficacy may follow from the removal of adsorbates and/or from the alteration of surface site geometry (e.g., by inducing surface reconstructions or altering surface roughness). Investigations of $TiO_2$ (110) and ZnO (0001) surfaces show that geometric effects play a much larger role for $TiO_2$ than for ZnO (0001).

Returning to the method of controlling vacancy concentration, the liquid water to which the treated surface of the crystalline metal oxide is exposed during the method may be part of an aqueous solution that includes additional components, e.g., one or more solutes and/or co-solvents. For example, the aqueous solution may include an amine or other basic species to adjust the pH of the aqueous solution to greater than 7. Experiments show that increased basicity can accelerate oxygen injection. In other examples, the aqueous solution may include an acidic species to adjust the pH of the aqueous solution to less than 7. Accordingly, the aqueous solution may comprise a pH of greater than 7, less than 7, or equal to 7.

The aqueous solution may also or alternatively include one or more salts, such as a metal salt or another water-soluble compound. Examples may include zinc fluoride, zinc chloride, manganese chloride, potassium hexafluorotitanate (IV) ($K_2(TiF_6)$), and/or ammonium titanyl oxalate (($NH_4)_8[TiO(C_2O_4)_2]_4$). It is believed that the physics of cation (e.g., $Ti^{+4}$, $Zn^{+2}$) injection may be similar to that of oxygen interstitials in that cation injection and diffusion may occur even at room temperature, or within tens of degrees of room temperature, as described above. Recent experiments demonstrating injection of $Mn^{+2}$ into a $TiO_2$ surface are described below and show the impact of pH level on cation injection.

It is further contemplated that a bias voltage may be applied to electrodes in contact with the aqueous solution (or water) to promote injection of the cations and/or the atomic oxygen into the crystalline metal oxide. In some examples, the aqueous solution may include an electrolyte. Experiments show a strong electrochemical enhancement of oxygen interstitial injection. Both the injection rate and penetration depth may increase by up to one or two orders of magnitude by utilizing a bias voltage, as shown in the data described below.

Figure 5A:
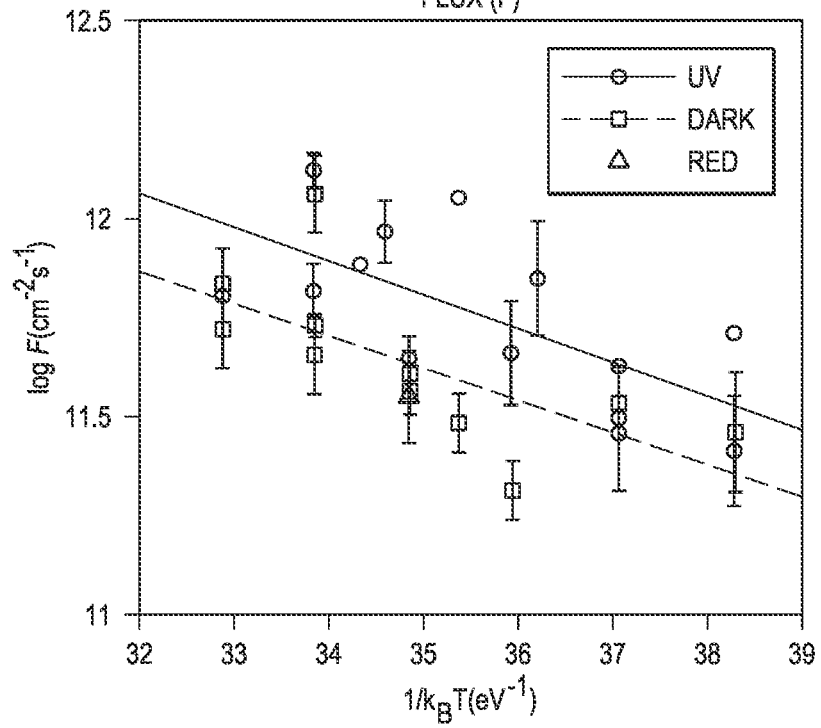
FIG. 5A plots net injection flux (F) as a function of $1/k_BT$ for a treated $TiO_2$ (110) surface illuminated by UV light during water exposure at a temperature of 40° C., in comparison to analogous data obtained with red laser light and light-shielding (dark) conditions.
Figure 5B:
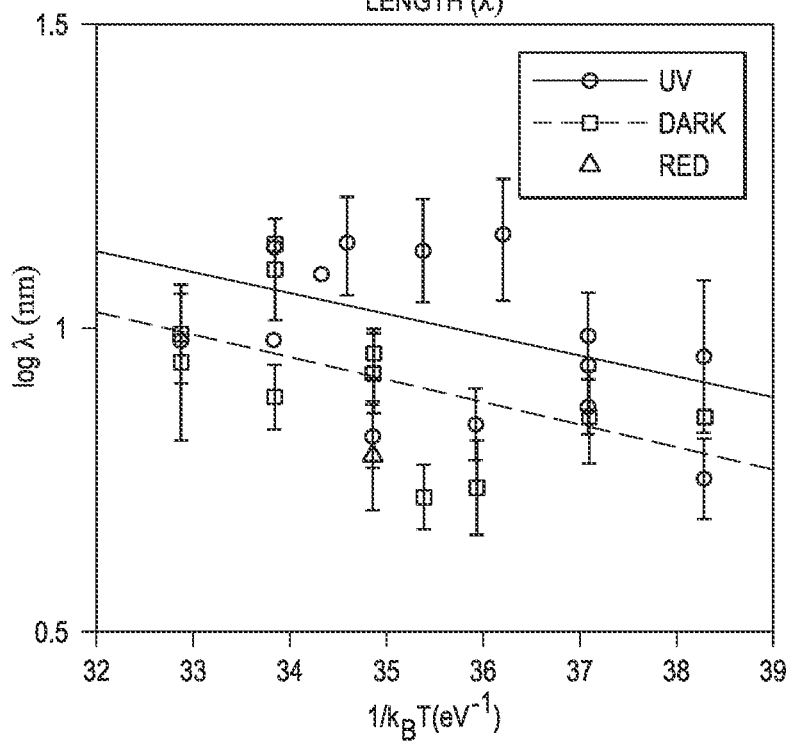
FIG. 5B plots mean diffusion length ($\lambda$) as a function of $1/k_BT$ for a treated $TiO_2$ (110) surface illuminated by UV light during water exposure at a temperature of 40° C., in comparison to analogous data obtained with red laser light and light-shielding (dark) conditions.

In another approach, the treated surface may be illuminated with ultraviolet radiation during the exposure to the water/aqueous solution in order to enhance injection. Referring to FIGS. 5A and 5B, experiments with $TiO_2$ (110) show that, when the treated surface is illuminated with UV light during water exposure at a temperature from 30–<100° C. (40° C. in this set of experiments), the UV light enhances the exchange rate of $O_i$ in comparison with red laser light (e.g., 635 nm diode laser) and light-shielding (dark) conditions. The UV light may have a wavelength selected to encompass photon energies higher than the band gap of the semiconducting metal oxide. Thus, the approach may be effective with narrow band gap semiconductors, e.g., highly-doped crystalline metal oxides, such as Ce- or Er-doped $ZrO_2$, or N-doped $TiO_2$.

EXAMPLES

Experimental Methods

All rutile $TiO_2$ specimens are single crystal and polished on one side. Undoped rutile $TiO_2$(110) (MTI Corp.) is cut to 5-10 mm×5 mm×0.5 mm and is undoped. Atomic force microscopy indicates that the oxide has a surface roughness of <5 Å. To remove surface poisons that may inhibit $O_i$ creation, specimens of $TiO_2$(110) are treated with a liquid solution of 30% $NH_4OH$ and $H_2O$ mixed in a 1:2 ratio for 40 min at 25° C.

Isotopic self-diffusion using liquid water employs a custom-designed apparatus wherein single crystals are immersed in 5 ml of $^{18}O$-labeled water $H_2^{18}O$ (10 atomic % $^{18}O$, Sigma-Aldrich) at temperatures ranging between 30 and 80° C. for 1 h in a laboratory air environment. The incorporated $^{18}O$ concentration profiles are measured by ex-situ time-of-flight secondary ion mass spectrometry (TOF-SIMS, PHI-TRIFT III instrument) employing a Cs ion beam source operating at 3 keV, with baseline concentrations checked against known isotopic fractions. In many cases multiple profiles are measured at up to three different places on a specimen's surface.

In cases where a bias voltage is applied, a Ag/AgCl reference electrode is also immersed in the aqueous solution, and the single crystal is connected to the electrodes of the electrochemical circuit using carbon tape. No electrolyte is added to the water in this example. Biases are applied using a potentiostat as part of the circuit.

In separate electrochemical experiments carried out at a temperature of 25° C. for 1 h to evaluate cation injection, $MnCl_2$ (0.5 M) is dissolved in the $^{18}O$-labeled water and the pH is adjusted with hydrochloric acid to values of 2 and 4.5.

Modeling to Obtain Profile Metrics

Profile metrics are obtained using an analytical mesoscale approach based upon profile-by-profile determination of the slopes and intercepts in semi-logarithmic plots. The approach makes few assumptions about the kinetic mechanisms at play, and yields parameters representing composites of elementary-step rate constants. This approach works well in a short-time asymptotic limit wherein the mobile intermediate transporting the label becomes immobile at sequestration sites and remains there for the duration of the experiment. The profile slope yields the mean diffusion length λ while the intercept yields the net injection flux F. These two composite parameters yield a third useful profile metric, the effective diffusivity $D_{eff}$.

The model assumes that only one sequestration event occurs for each $O_i$ during the experiment—a plausible assumption because $O_i$ retains appreciable mobility even at room temperature. This mobility, together with the stability of diffused profiles toward long-term storage near 25° C., indicates that any $O_i$ present after injection ends soon becomes trapped.

Because the water is only 10% isotopically pure in $^{18}O$, computation of the net injection flux F includes a factor of 10 to represent the total injected flux of both isotopes. $D_{eff}$ is a phenomenological parameter that does not equal the tracer diffusivity (as it does in prior gas exchange experiments) because at these low temperatures, the solids are far from equilibrium.

Electrochemical Results $O_i$ Injection—FIGS. 6A and 6B show log λ, which is indicative of the mean diffusion length of the atomic oxygen and log F, which is indicative of the net injection rate of the atomic oxygen, versus bias voltage. The data reveal enhancements of about 10 times in both penetration depth and injection rate. Surprisingly, the enhancements are found for both positive and negative biases. The data indicate a turn-on threshold of about ±0.1-0.2 V.

Cation Injection—FIG. 7 shows concentration profiles for $Mn^{+2}$ in rutile $TiO_2$ corresponding to a bias voltage of +0.4 V vs Ag/AgCl, as measured by SIMS. The profiles correspond to as-received rutile $TiO_2$ prior to electrochemical exposure to the Mn-containing aqueous solution, and after electrochemical exposure to the Mn-containing aqueous solution. Diffusion of Mn is very clear at pH=4.5. It can be seen that Mn penetrates up to nearly 200 nm into single crystalline $TiO_2$ at room temperature under suitably chosen conditions of voltage bias and pH. Manganese is believed to diffuse in rutile via a mechanism involving interstitials. The data reveal that facile injection and diffusion of interstitial atoms near room temperature is not limited to oxygen, but extends to metal cations as well. This discovery may open the door to post-synthesis oxide doping with metal atoms, with possible applications in photocatalysis, diluted magnetic semiconductors, oxide electronics and others.

The subject matter of the disclosure may also relate to the following aspects:

A first aspect relates to a method of controlling oxygen vacancy concentration in a semiconducting metal oxide, the method comprising: exposing a treated surface of a crystalline metal oxide to water at a temperature and pressure sufficient to maintain the water in a liquid phase, whereby, during the exposure: a portion of the water is adsorbed onto the treated surface and dissociates into atomic oxygen and hydrogen, and the atomic oxygen is injected into and diffuses through the crystalline metal oxide, thereby forming isolated oxygen interstitials and oxygen defect complexes, wherein the isolated oxygen interstitials replace oxygen vacancies in the crystalline metal oxide.

A second aspect relates to the method of the first aspect wherein the water comprises $H_2O$, $H_2^{18}O$, and/or $2H_2O$.

A third aspect relates to the method of the first or the second aspect, wherein the temperature is less than 100° C. and the pressure is atmospheric pressure.

A fourth aspect relates to the method of the third aspect, wherein the temperature is in a range from about 30° C. to <100° C.

A fifth aspect relates to the method of any preceding aspect, wherein at least some of the atomic oxygen diffuses within the crystalline metal oxide to a depth of about 20 nm to about 1,000 nm.

A sixth aspect relates to the method of any preceding aspect, wherein the temperature is at least 100° C. and the pressure is in a range from greater than about 1 bar (about 100 kPa) to about 100 kbar (about 10 GPa).

A seventh aspect relates to the method of any preceding aspect, wherein the temperature is in a range from about 150° C. to about 250° C. and the pressure is in a range from about 10 bar (about 1 MPa) to about 20 kbar (about 2 GPa).

A eighth aspect relates to the method of any preceding aspect, wherein at least some of the atomic oxygen diffuses within the crystalline metal oxide to a depth greater than 1,000 nm.

A ninth aspect relates to the method of any preceding aspect, further comprising, after a time duration sufficient for diffusion of the atomic oxygen to a predetermined depth within the crystalline metal oxide, halting the exposure of the treated surface to the water.

A tenth aspect relates to the method of the ninth aspect, wherein the time duration is in a range from about 10 minutes to 100 hours, from 10 minutes to about 120 minutes, and/or from about 30 minutes to about 90 minutes.

An eleventh aspect relates to the method of any preceding aspect, wherein the crystalline metal oxide comprises a semiconducting metal oxide selected from the group consisting of: $TiO_2$, ZnO, $Ga_2O_3$, $SrTiO_3$, $SnO_2$, $In_2O_3$, ITO, $WO_3$, $Cr_2O_3$, CuO, $Co_2O_3$ and/or a perovskite.

A twelfth aspect relates to the method of any preceding aspect, wherein the crystalline metal oxide has at least one linear dimension of about 1 micron or less, or about 100 nm or less.

A thirteenth aspect relates to the method of any preceding aspect, wherein the treated surface is a polar surface, the polar surface being cation- or anion-terminated.

A fourteenth aspect relates to the method of any preceding aspect, wherein the treated surface is a non-polar surface.

A fifteenth aspect relates to the method of any preceding aspect, wherein the oxygen defect complexes comprise: interstitial oxygen ($O_i$) and a metal cation vacancy (VM), interstitial oxygen ($O_i$) and a metal cation interstitial (Mi), and/or interstitial oxygen ($O_i$) and hydrogen (H).

A sixteenth aspect relates to the method of any preceding aspect, wherein the oxygen defect complexes comprise interstitial oxygen ($O_i$) and hydrogen (H), and wherein, after the exposure of the treated surface to the water, the crystalline metal oxide exhibits increased p-type character compared to before the exposure.

A seventeenth aspect relates to the method of any preceding aspect, wherein the atomic hydrogen dissociated from the water remains on the treated surface.

An eighteenth aspect relates to the method of any preceding aspect, wherein the water is part of an aqueous solution comprising one or more solutes and/or co-solvents.

A nineteenth aspect relates to the method of any preceding aspect, wherein the aqueous solution comprises an amine or another basic species so as to comprise a pH of greater than 7.

A twentieth aspect relates to the method of any preceding aspect, wherein the aqueous solution comprises one or more salts.

A twenty-first aspect relates to the method of the twentieth aspect, wherein the aqueous solution comprises an electrolyte, and further comprising applying a bias voltage to electrodes in contact with the aqueous solution during the exposure.

A twenty-second aspect relates to the method of any preceding aspect, further comprising, during the exposure, illuminating the treated surface with ultraviolet radiation.

A twenty-third aspect relates to the method of the twenty-second aspect, wherein the ultraviolet radiation has a wavelength encompassing photon energies higher than a band gap of the crystalline metal oxide.

A twenty-fourth aspect relates to any preceding method, further comprising preparing the treated surface of the crystalline metal oxide, the preparing comprising: degreasing a surface of the crystalline metal oxide, followed by wet etching of the surface and/or vacuum annealing of the crystalline metal oxide, thereby forming the treated surface.

A twenty-fifth aspect relates to the method of the twenty-fourth aspect, wherein the wet etching comprises exposing the surface to hydrogen peroxide ($H_2O_2$) and/or ammonium hydroxide ($NH_4OH$).

A twenty-sixth aspect relates to the method of the twenty-fourth or twenty-fifth aspect, wherein the degreasing comprises exposing the surface to acetone, isopropyl alcohol, ethanol and/or methanol.

A twenty-seventh aspect relates to the method of any of the twenty-fourth through the twenty-sixth aspects, wherein the vacuum annealing comprises heating the surface at a temperature in a range from about 400° C. to about 550° C. at an oxygen pressure $PO_2$ in a range from about $1 \times 10^{-6}$ Torr to about $4 \times 10^{-4}$ Torr.

A twenty-eighth aspect relates to a semiconducting metal oxide made by the method of any preceding aspect.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein.

Furthermore, the advantages described above are not necessarily the only advantages of the invention, and it is not necessarily expected that all of the described advantages will be achieved with every embodiment of the invention.

The invention claimed is:

1. A method of controlling oxygen vacancy concentration in a semiconducting metal oxide, the method comprising:
    exposing a treated surface of a crystalline metal oxide to water at a temperature and pressure sufficient to maintain the water in a liquid phase, whereby, during the exposure:
        a portion of the water is adsorbed onto the treated surface and dissociates into atomic oxygen and hydrogen, and
        the atomic oxygen is injected into and diffuses through the crystalline metal oxide, thereby forming isolated oxygen interstitials and oxygen defect complexes,
    wherein the isolated oxygen interstitials replace oxygen vacancies in the crystalline metal oxide.

2. The method of claim 1, further comprising, during the exposure, applying a bias voltage to electrodes in contact with the water.

3. The method of claim 1, wherein the water is part of an aqueous solution comprising one or more solutes and/or co-solvents.

4. The method of claim 3, wherein the aqueous solution comprises one or more salts comprising one or more metal cations.

5. The method of claim 4, wherein the one or more metal cations are injected into and diffuse through the crystalline metal oxide.

6. The method of claim 3, wherein the aqueous solution comprises an acidic species so as to comprise a pH of less than 7.

7. The method of claim 3, wherein the aqueous solution comprises a basic species so as to comprise a pH of greater than 7.

8. The method of claim 1, further comprising, during the exposure, illuminating the treated surface with ultraviolet radiation.

9. The method of claim 8, wherein the ultraviolet radiation has a wavelength encompassing photon energies higher than a band gap of the crystalline metal oxide.

10. The method of claim 1, wherein the temperature is less than 100° C. and the pressure is atmospheric pressure.

11. The method of claim 1, wherein the temperature is at least 100° C. and the pressure is in a range from greater than about 100 kPa to about 10 GPa.

12. The method of claim 1, wherein at least some of the atomic oxygen diffuses within the crystalline metal oxide to a depth of about 20 nm to about 1,000 nm.

13. The method of claim 1, wherein at least some of the atomic oxygen diffuses within the crystalline metal oxide to a depth greater than 1,000 nm.

14. The method of claim 1, wherein the crystalline metal oxide comprises a semiconducting metal oxide selected from the group consisting of: $TiO_2$, $ZnO$, $Ga_2O_3$, $SrTiO_3$, $SnO_2$, $In_2O_3$, ITO, $WO_3$, $Cr_2O_3$, $CuO$, $Co_2O_3$ and/or a perovskite.

15. The method of claim 1, wherein the crystalline metal oxide has at least one linear dimension of about 1 micron or less.

16. The method of claim 1, wherein the oxygen defect complexes comprise: interstitial oxygen ($O_i$) and a metal cation vacancy ($V_M$), interstital oxygen ($O_i$) and a metal cation interstitial ($M_i$), and/or interstitial oxygen ($O_i$) and hydrogen (H).

17. The method of claim 1, wherein the oxygen defect complexes comprise interstitial oxygen ($O_i$) and hydrogen (H), and
    wherein, after the exposure of the treated surface to the water, the crystalline metal oxide exhibits increased p-type character compared to before the exposure.

18. The method of claim 1, further comprising preparing the treated surface of the crystalline metal oxide, the preparing comprising:
    degreasing a surface of the crystalline metal oxide, followed by wet etching of the surface and/or vacuum annealing of the crystalline metal oxide, thereby forming the treated surface.

19. The method of claim 18, wherein the wet etching comprises exposing the surface to hydrogen peroxide ($H_2O_2$) and/or ammonium hydroxide ($NH_4OH$).

* * * * *